(12) United States Patent
Bruekers et al.

(10) Patent No.: US 6,275,176 B1
(45) Date of Patent: Aug. 14, 2001

(54) ARITHMETIC ENCODING/DECODING OF A DIGITAL INFORMATION SIGNAL

(75) Inventors: Alphons A. M. L. Bruekers; Adriaan J. Rijnberg, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/271,746

(22) Filed: Mar. 18, 1999

(30) Foreign Application Priority Data

Mar. 19, 1998 (EP) .................................................. 98200869

(51) Int. Cl.[7] ...................................................... H03M 7/00
(52) U.S. Cl. ........................ 341/107; 348/394.1; 382/247
(58) Field of Search ..................................... 341/107, 155, 341/51, 50, 63, 65, 67; 348/394.1; 382/247

(56) References Cited

U.S. PATENT DOCUMENTS

| | | | |
|---|---|---|---|
| 4,075,655 | * 2/1978 | Iijima et al. ....................... | 348/394.1 |
| 5,023,611 | * 6/1991 | Chamzas et al. ..................... | 341/107 |
| 5,471,206 | * 11/1995 | Allen et al. ........................... | 341/107 |
| 5,475,388 | * 12/1995 | Gormish et al. ...................... | 341/107 |
| 5,557,274 | * 9/1996 | Hirooka et al. ....................... | 341/155 |
| 5,592,163 | * 1/1997 | Kimura et al. ........................ | 341/107 |
| 6,055,338 | * 4/2000 | Endo et al. ........................... | 382/232 |

* cited by examiner

*Primary Examiner*—Peguy JeanPierre
*Assistant Examiner*—Jean B JeanGlaude
(74) *Attorney, Agent, or Firm*—Michael E Belk

(57) ABSTRACT

Audio signals are converted from analog into digital using the well-known sigma-delta modulation techniques. The digital signal then consists of a sequence of 1-bit samples at a frequency of e.g. 2822400 Hz (=64*44100 Hz). Lossless coding techniques are used to reduce the required storage- or transmission-capacity for these 1-bit oversampled audio signals. The performance (compression ratio) of the lossless coder for 1-bit oversampled audio signals is improved by sometimes overruling the probability signal for the lossless coder.

26 Claims, 3 Drawing Sheets

ARITHMETIC ENCODING/DECODING OF A DIGITAL INFORMATION SIGNAL

FIELD OF THE INVENTION

The invention relates to the field of arithmetic encoder apparatus for arithmetically encoding a digital information signals.

An arithmetic encoder is disclosed in the publication 'Improved lossless coding of 1-bit audio signals', by F. Bruekers et al, preprint 4563(I-6), presented at the 103rd Convention of the AES, Sep. 26–29, 1997.

The above citations are hereby incorporated in whole by reference.

SUMMARY OF THE INVENTION

The invention aims at providing measures to improve the lossless coding using the arithmetic coder disclosed in the prior art.

In accordance with the invention, the arithmetic coder includes:

input apparatus for receiving the digital information signal, an arithmetic coder having a first input for receiving an input signal, a second input for receiving a probability signal, and an output for supplying an output signal, the arithmetic coder being adapted to carry out a data compression step on the input signal in response to the probability signal so as to obtain a data compressed version of the input signal, and to supply the data compressed version of the input signal to the output, a probability signal generator for generating the probability signal for the arithmetic coder, characterized in that the apparatus further includes a switch for switching the arithmetic coder into an encoding mode for coding one or more symbols of the input signal into corresponding symbols of an output signal, which are substantially identical to the symbols of the input signal.

The invention is based on the recognition that the prediction filter and the probability table are designed for an optimal average performance, but that their local performance can be far from optimal. This can result in a low compression efficiency. In accordance with the invention, the arithmetic coder is switched into a compression mode, such that it encodes the signal received into an encoded output signal which is substantially identical to the signal received. This can eg. be realized by switching the arithmetic coder into an encoding mode for encoding the signal received as if a predetermined and fixed probability signal were applied to the arithmetic coder.

Those skilled in the art will understand the invention and additional objects and advantages of the invention by studying the description of preferred embodiments below with reference to the following drawings which illustrate the features of the appended claims:

BRIEF DESCRIPTION OF THE DRAWING

These and other aspects of the invention will be further explained hereafter in the figure description, in which FIG. 1a shows a circuit diagram of a lossless encoder and FIG. 2a shows a circuit diagram of a corresponding decoder, using linear prediction and arithmetic coding, FIG. 3 shows an example a signal encoded, showing the number of bits transmitted in case of:

(a) no coding (dot-line), (b) all bits coded using the probability table (solid-line) and (c) for the first 128 bits, the output of the probability table is overruled by $p_0=p_1=\frac{1}{2}$ (broken-line), and where it turns out that the overruling improves the compression ratio.

Figure 4:
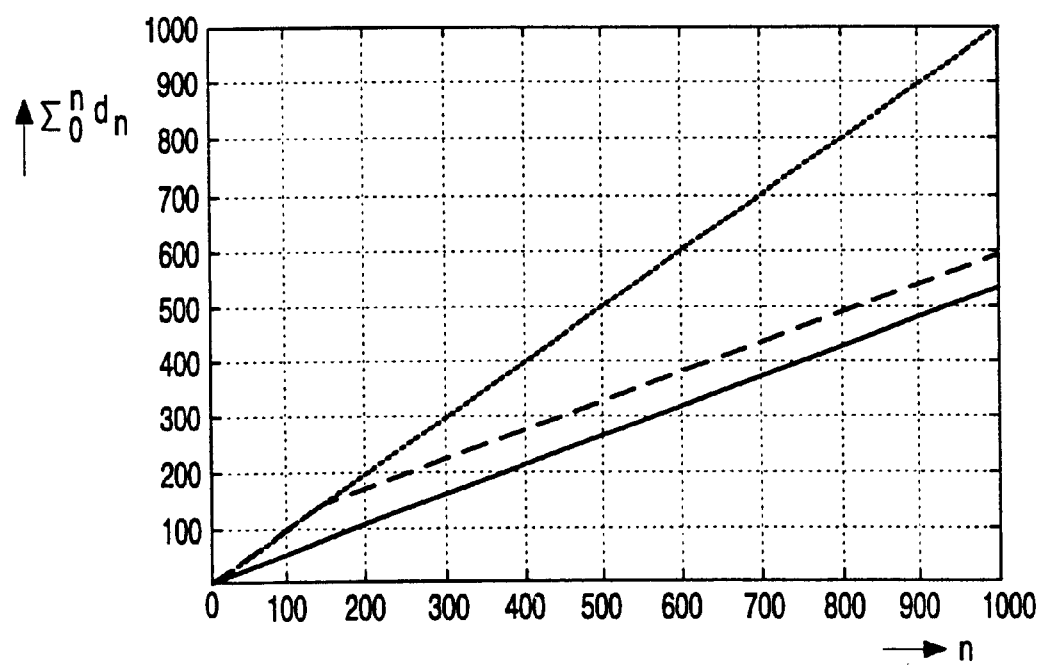

FIG. 4 shows another example of a signal encoded, showing the number of bits transmitted in case of:

(a) no coding (dot-line), (b) all bits coded using the probability table (solid-line) and (c) for the first 128 bits the output of the probability table is overruled by $p_0=p_1=\frac{1}{2}$ (broken-line) and where it turns out that the overruling makes the compression ratio worse.

Figure 5A:
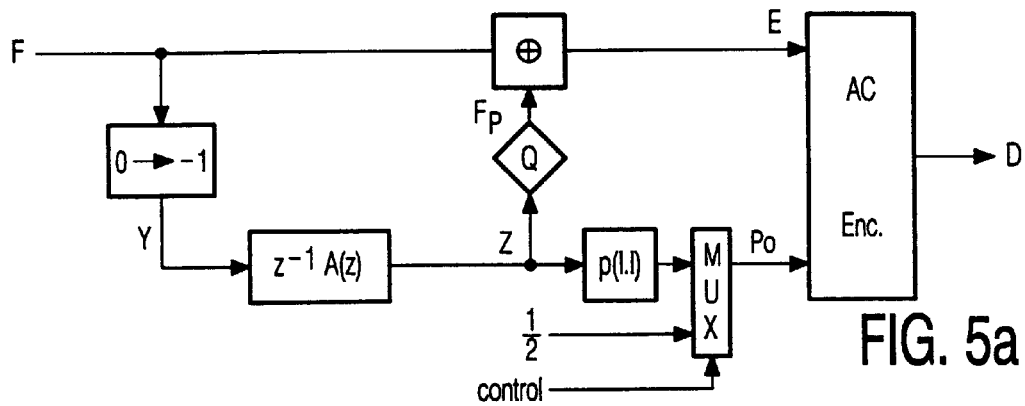
Figure 5B:
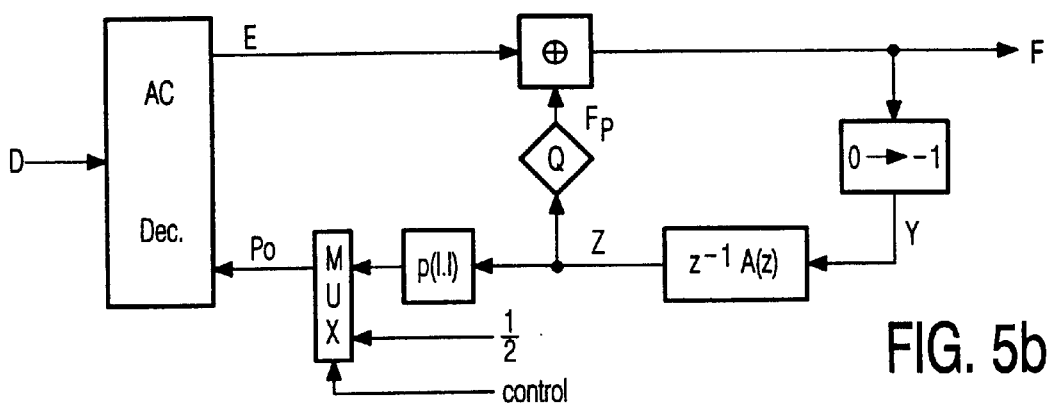
Figure 6A:
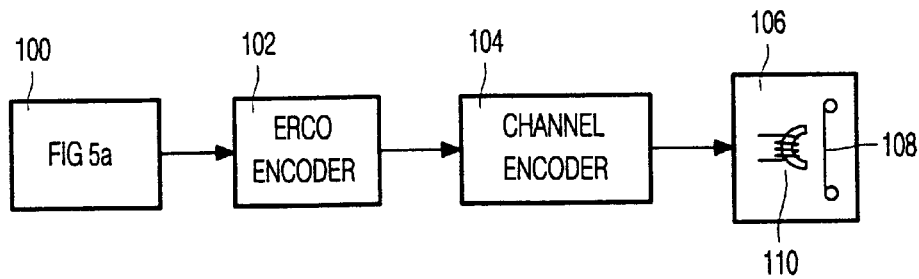
Figure 6B:
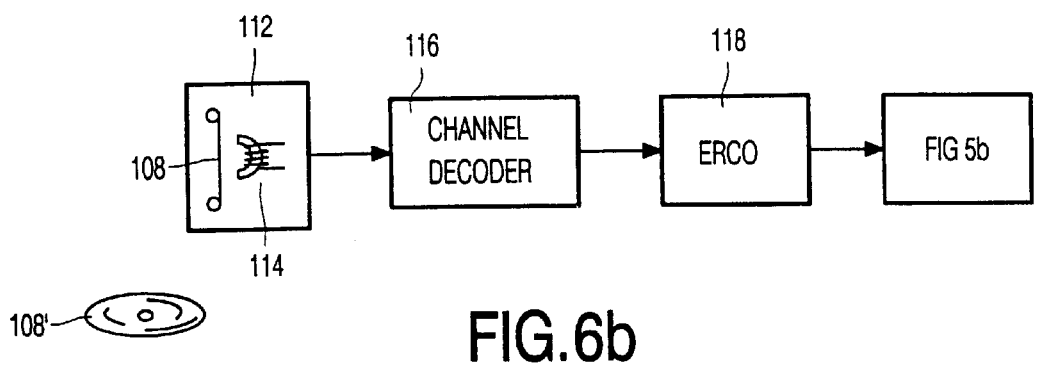

FIG. 5a shows a circuit diagram of a lossless encoder in accordance with the invention and FIG. 5b shows a circuit diagram of corresponding decoder, both having a apparatus to overrule the probability as provided by the probability table (p(|.|)), FIG. 6a shows the lossless encoder of FIG. 5a included in a transmitter, which is in the form of a recording apparatus, and FIG. 6b shows the lossless decoder included in a receiver, which is in the form of a reproducing apparatus.

DETAILED DESCRIPTION OF THE PREFERRED EMBODIMENT

The process of lossless encoding and decoding, for the example of 1-bit oversampled audio signals, will be explained briefly hereafter with reference to FIG. 1, which shows an embodiment of the arithmetic encoder apparatus in FIG. 1a, and shows an embodiment of the arithmetic decoder apparatus in FIG. 1b.

Figure 1A:
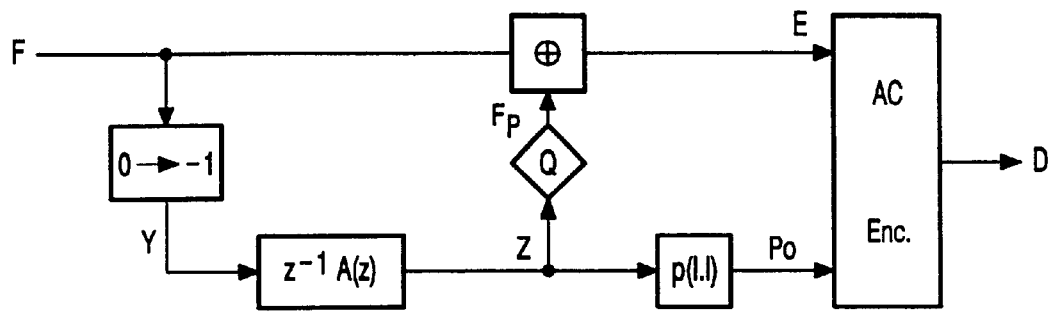
Figure 2:
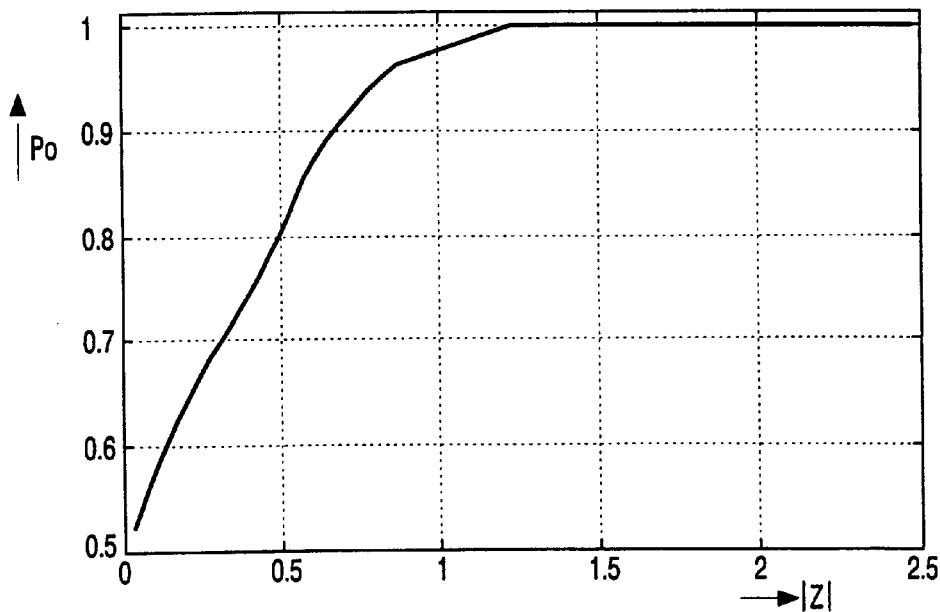
FIG. 2 shows an example of probability $p_0$ of a correct prediction as function of the predictor filter output $|Z|$.

The lossless coding in the apparatus of FIG. 1a is performed on isolated parts (frames) of the audio signal. A typical length of such a frame is 37632 bits. The two possible bit-values of the input signal F, '1' and '0', represent the sample values +1 and −1 respectively. Per frame, the set of coefficients for the prediction filter $z^{-1}.A(z)$ is determined by e.g. the autocorrelation method. The sign of the filter output signal, Z, determines the value of the predicted bit $F_p$, whereas the magnitude of the filter output signal, Z, is an indication for the probability that the prediction is correct. A correct prediction, or $F=F_p$, is equivalent to $E=0$ in the residual signal E. The content of the probability table, p(|.|), is designed per frame such that per possible value of Z, $p_0$ is the probability that $E=0$. A typical content of the probability table is shown in FIG. 2. For small values of |Z| the probability for a correct prediction is close to 0.5 and for large values of |Z| the probability for a correct prediction is close to 1.0. Clearly the probability for an incorrect prediction, $F \neq F_p$ or $E=1$, is $p_1=1-p_0$.

The arithmetic encoder (AC Enc.) in the apparatus of FIG. 1a codes the sequence of bits of E such that the code (D) requires less bits. For this, the arithmetic coder uses the probability that bit n of signal E, E[n], has a particular value. The number of bits to code the bit E[n]=0 is:

$$d_n = -^2\log(p_0) + \epsilon \text{(bits)} \qquad \text{(Eq. 1)}$$

which is practically not more than 1 bit, since $p_0 \geq \frac{1}{2}$ (see FIG. 2). The number of bits to code the bit E[n]=1 is:

$$d_n = -2\log(p_1) + \epsilon = -^2\log(1-p_0) + \epsilon \text{(bits)} \qquad \text{(Eq. 2)}$$

which is not less than 1 bit. The $\epsilon$ in both equations represents the non-optimal behavior of the arithmetic coder, but can be neglected in practice.

A correct prediction (E[n]=0) results in less than 1 bit and an incorrect prediction (E[n]=1) results in more than 1 bit in the code (D). The probability table is designed such that on the average for the complete frame, the number of bits for code D is minimal.

Besides code D, also the coefficients of the prediction filter and the content of the probability table have to be transmitted from encoder to decoder.

Figure 1B:
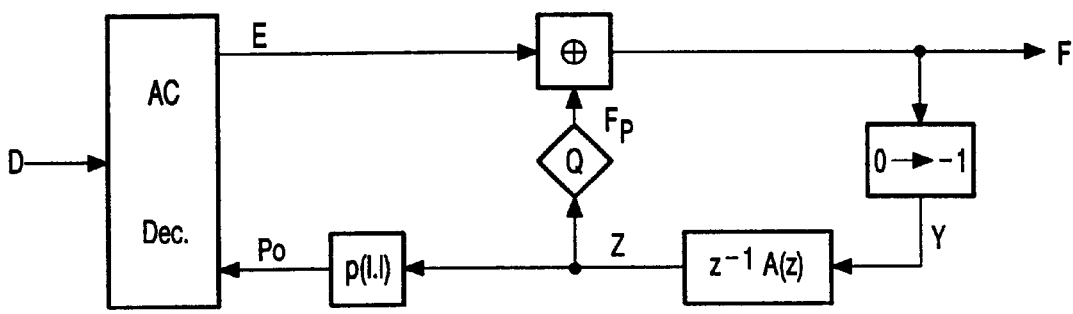

In the decoder apparatus of FIG. 1b, exactly the inverse of the encoder process is implemented thus creating a lossless coding system. The arithmetic decoder (AC Dec.) is provided with the identical probabilities as the arithmetic encoder was, to retrieve the correct values of signal E. Therefore, the decoder contains the same prediction filter and probability table as the encoder.

The problem solved by the present invention can now be identified. Although both the prediction filter and the probability table are designed, such that their average performance is optimal, their local performance can be bad. An example for this is the start of a frame where the prediction filter has no actual samples available to predict the next sample. Therefore the prediction filter output signal is not always a reliable indicator for the probability of a correct prediction.

Figure 3:
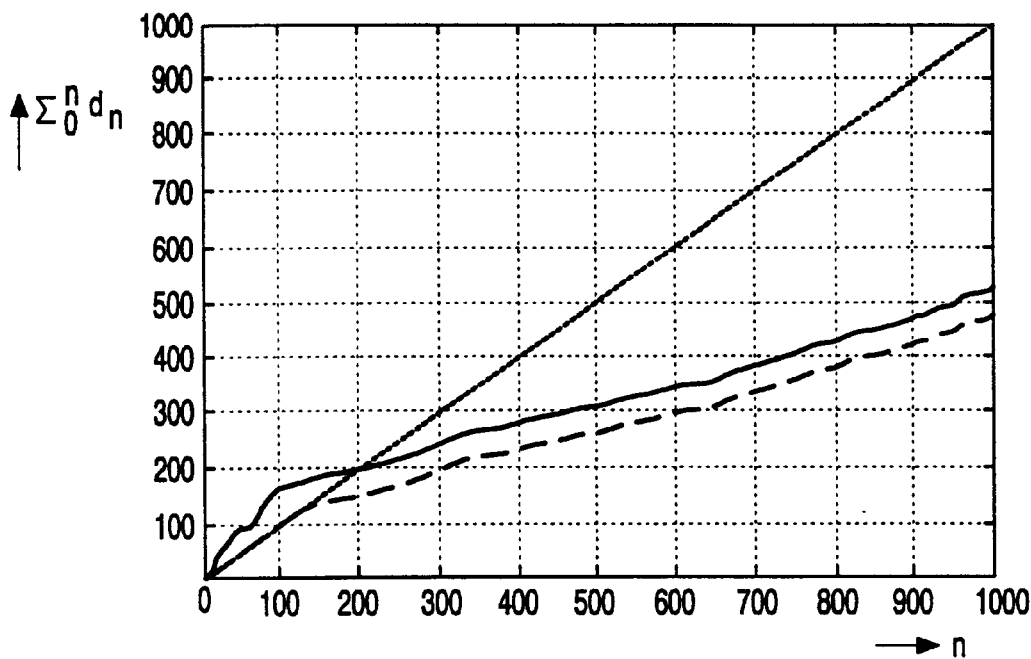

This has been further explained with reference to FIG. 3. The solid-line in FIG. 3 is the number of bits of the code word D needed to code the first n bits of signal E. The dot-line gives the number of bits of the code word D in case of no compression. For coding the first 1000 bits of signal E, only about 500 bits are required in the code word D. However, for the first 100 bits of the same signal E, about 170 bits are required in the code word D. In the latter case, actually more bits are required for the code than for the original signal. For another frame the same quantities are shown in FIG. 4 where no problem is encountered in coding the first 100 bits of signal E. Also, at other places than the start of a frame, it can happen that the coding performs badly. In such case, it is better to transmit the original bits of E than the coded version D.

The problem now is to merge the code word D with parts of the original signal E such that the decoder can retrieve the correct data. This has been solved in the following way.

From equations eq. 1 and eq. 2, it can be seen that for $p_0=\frac{1}{2}$ the number of bits in the code word, D, is: $d_n \approx -^2\log(\frac{1}{2})=1$. This means, that it makes practically no difference for the compression ratio of the lossless coder, whether a single bit of E is transmitted directly or coded with probability $p_0=\frac{1}{2}$. So, if for the part of signal E, where the prediction performs badly, the probability as provided by the probability table is overruled by the value $\frac{1}{2}$, the compression ratio is improved. According to this approach there is no problem in merging the code word D with parts of the original signal E.

In FIG. 3 and FIG. 4, the broken-line gives the number of bits of the code word D in a case in which the first 128 bits (i.e. the order of prediction) are coded with probability $p_0=p_1=\frac{1}{2}$. In the case of FIG. 3, the compression ratio improves, and in the case of FIG. 4, the compression ratio gets worse. These two examples show the necessity of making, the overruling of the probability as provided by the probability table for the first bits of a frame, selectable. This can be indicated by a single bit in the control data that is transmitted from encoder to decoder.

The number of bits, in the beginning of a frame for which the prediction performs worse and for which it is better to overrule the probability as provided by the probability table, depends on the order of the prediction filter. The actual number of bits for which it is better to overrule the probability, can be transmitted from encoder to decoder explicitly. It is also possible, to link this number to the prediction order e.g. identical to the prediction order or a known fraction of the prediction order.

To identify a first place somewhere else in the frame where the prediction performs worse and for which it is better to overrule the probability as provided by the probability table, many methods are suitable. As an example, both the index of the first bit, and the total number of bits for which the probability as provided by the probability table is overruled can be specified in the control data that is transmitted from encoder to decoder.

To identify a next place in the frame where the prediction performs worse and for which it is better to overrule the probability as provided by the probability table, the same method as for the first place can be used. However, it may be advantageous to identify the start of this next place not in absolute terms, but relative to the previous place where it was better to overrule the probability, as provided by the probability table. In FIGS. 5a and 5b, it is shown that a multiplexer can be used to overrule the probability signal.

It may be advantageous for the compression ratio of the lossless coder to overrule the probability as provided by the probability table with a different value than the value $\frac{1}{2}$. In that case, the actual value has to be transmitted from encoder to decoder somehow.

The decision whether the probability as provided by the probability table should be overruled to improve the compression ratio, can be taken without actually coding the data. On basis of equation 1 and 2 it can be determined what decision is optimal.

FIG. 6a shows an embodiment of a transmission apparatus which is in the form of a recording apparatus. The recording apparatus includes the data compression apparatus shown in FIG. 5a. The recording apparatus further includes a write unit 106 for writing the data compressed information signal in a track on the record carrier 108. In the present example, the record carrier 108 is a magnetic record carrier, so that the write unit 106 includes at least one magnetic head 110 for writing the data compressed information signal in the record carrier 108. The record carrier may however, be an optical record carrier, such as a CD disk or a DVD disk 108'.

Transmission via a transmission medium, such as a radio frequency link or a record carrier, generally requires an error correction encoding and a channel encoding carried out on the data compressed information signal to be transmitted. FIG. 6a shows such signal processing steps. The recording arrangement of FIG. 6a, therefore includes an error correction encoder 102, well known in the art, and a channel encoder 104, also well known in the art.

FIG. 6b shows the data expansion apparatus of FIG. 5b incorporated in a receiver apparatus, which is in the form of a reproduction apparatus. The reproducing apparatus further comprises a read unit 112 for reading the data compressed information signal from a track on the record carrier 108. In the present example, the record carrier 108 is a magnetic record carrier, so that the read unit 112 includes at least one magnetic head 114 for reading the data compressed information signal from the record carrier 108. The record carrier may however, be an optical record carrier, such as a CD disk or a DVD disk 108'.

As has been explained above, transmission via a transmission medium, such as a radio frequency link or a record carrier, generally requires an error correction encoding and a channel encoding carried out on the data compressed n-level information signal to be transmitted, so that a corresponding channel decoding and error correction can be carried out upon reception. FIG. 6b shows the signal processing steps of channel decoding and error correction carried out on the received signal, received by the reading apparatus 112. The reproducing arrangement of FIG. 6b therefore includes a channel decoder 116, well known in the art, and an error correction unit 118, also well known in the art, so as to obtain a replica of the data compressed information signal.

Whilst the invention has been described with reference to preferred embodiments thereof, it is to be understood that these are not limitative examples. Thus, various modifications may become apparent to those skilled in the art, without departing from the scope of the invention, as defined by the claims.

As an example, the system described above dealt with two-level signals only. In that situation, a probability signal in the form of only one probability value for each symbol to be encoded is required. The probability signal generated by the probability signal generator unit, denoted by $p(|.|)$, was overruled by a probability signal equal to ½. The presented idea is, however, also applicable in case of multi-level signals. The probability signal in the form of the value p=½ should then be replaced by another probability signal that is optimal for that situation. An example: for an N-level signal to be encoded in the arithmetic coder, a probability signal in the form of N−1 probability values is required for supply to probability signal input of the arithmetic coder. The probability signal for overruling the probability signal generated by the probability signal generator unit, denoted $p(|.|)$, could be such that all the N−1 probability values are equal to 1/N.

Further, the invention ties in each and every novel feature or combination of features.

What is claimed is:

1. Apparatus for arithmetically encoding a digital information signal, comprising:
   input means for receiving the digital information signal;
   arithmetic coder means having a first input for receiving the information signal as an input signal, a second input for receiving a probability signal, and an output for supplying an output signal, the arithmetic coder means compressing the input signal in response to the probability signal so as to obtain the output signal;
   probability signal generation means for generating the probability signal for the arithmetic coder means; and
   means for switching the arithmetic coder means into an encoding mode, the switching means including overruling means for overruling the probability signal to the arithmetic coder means and applying a predetermined and fixed probability signal to the arithmetic coder means, for encoding the one or more symbols of the input signal, which are substantially identical to the symbols of the input signal.

2. The apparatus of claim 1, in which:
   the input signal is an n-level digital signal;
   the overruling means applying a probability signal to the arithmetic coder means for encoding the one or more symbols in the input signal; and
   the probability signal including at least one probability value equal to 1/n.

3. The apparatus of claim 1, in which the overruling means include multiplexer means coupled between the probability signal generating means and the second input of the arithmetic coder means, the multiplexer means multiplexing the predetermined probability signal in response to a control signal in order to enable the encoding of the one or more symbols in the input signal.

4. The apparatus of claim 1, in which the input signal is identical to the digital information signal as received.

5. The apparatus of claim 1, in which:
   the input signal is an n-level digital signal and the overruling means applying a probability signal to the arithmetic coder means for encoding the one or more symbols in the input signal;
   the probability signal including at least one probability value equal to 1/n;
   n=2;
   the overruling means include multiplexer means coupled between the probability signal generating means and the second input of the arithmetic coder means, the multiplexer means multiplexing the predetermined probability signal to the second input in response to a control signal in order to enable the encoding of the one or more symbols in the input signal;
   the input signal is identical to the digital information signal prior to arithmetically encoding;
   the apparatus further comprising prediction filter means for deriving a predicted version of the digital information signal from the digital information signal;
   the apparatus further comprising signal combination means for combining the digital information signal and the predicted version of the digital information signal so as to obtain a residual version of the digital information signal as a residual signal, the residual signal being the input signal for the arithmetic coder means;
   the prediction filter means include a prediction filter for deriving a multi value prediction signal from the digital information signal;
   the prediction filter means include quantizing means for quantizing the multi value prediction so as to obtain the predicted version of the digital information signal;
   the probability signal generating means deriving the probability signal from the multi value prediction signal;
   the apparatus further comprising error correction encoding means for error correction encoding the output signal of the arithmetic coder means;
   the apparatus further comprising channel encoding means for channel encoding the output signal so as to enable transmission of the output signal via a transmission medium;
   the transmission medium is a record carrier;
   the apparatus further comprising writing means for writing the output signal onto the record carrier; and
   the apparatus further comprising conversion means for recording a signal which is representative of the control signal on the record carrier.

6. The apparatus of claim 1, further comprising:
   prediction filter means for deriving a predicted version of the digital information signal from the digital information signal; and
   signal combination means for combining the digital information signal and the predicted version of the digital information signal so as to obtain a residual version of the information signal as a residual signal, the residual signal being the input signal for the arithmetic coder means.

7. The apparatus of claim 6, in which the prediction filter means include:

a prediction filter for deriving a multi value prediction signal from the digital information signal; and quantizing means for quantizing the multi value prediction signal so as to obtain the predicted version of the digital information signal;

and in which the probability signal generating means derive the probability signal from the multi value prediction signal.

8. The apparatus of claim 1, further comprising: error correction encoding means for carrying out an error correction encoding on the output signal of the arithmetic coder means.

9. The apparatus of claim 1, further comprising: channel encoding means for carrying out a channel encoding step on the output signal so as to enable transmission of the output signal via a transmission medium.

10. The apparatus of claim 9, in which:

the transmission medium is a record carrier; and the apparatus further comprising writing means for writing the output signal onto the record carrier.

11. The apparatus of claim 10, further comprising conversion means for recording a signal which is representative of the control signal onto the record carrier.

12. The apparatus of claim 2, in which n=2.

13. A method for arithmetically encoding a digital information signal, comprising the steps of:

receiving the digital information signal;

providing the digital information signal to an input as an input signal;

arithmetically encoding the input signal in response to a probability signal so as to obtain a data compressed version of the input signal;

supplying the data compressed version of the input signal as an output signal;

generating the probability signal for the arithmetic encoding; and switching into an encoding mode, including the step of overruling the probability signal to the arithmetic encoding and applying a predetermined and fixed probability signal to the arithmetic encoding, for encoding the one or more symbols of the input signal, which are substantially identical to the symbols of the input signal.

14. The method of claim 13, further comprising the step of recording the output signal on a record carrier.

15. An apparatus, comprising:

a record carrier, the record carrier storing an encoded digital information signal, the digital information signal encoded by:

providing the digital information signal to an input as an input signal;

arithmetically encoding the input signal in response to a probability signal so as to obtain a data compressed version of the input signal;

supplying the data compressed version of the input signal as an output signal;

generating the probability signal for the arithmetic encoding; and switching into an encoding mode, including the step of overruling the probability signal to the arithmetic encoding and applying a predetermined and fixed probability signal to the arithmetic encoding, for encoding the one or more symbols of the input signal, which are substantially identical to the symbols of the input signal.

16. Apparatus for arithmetically decoding an arithmetically encoded digital information signal, comprising:

input means for receiving an arithmetically encoded digital information signal;

arithmetic decoder means having a first input for receiving the arithmetically encoded information signal as an input signal, a second input for receiving a probability signal, and an output for supplying an output signal, the arithmetic decoder means expanding the input signal in response to the probability signal so as to obtain the output signal;

probability signal generation means for generating the probability signal for the arithmetic decoder means;

output means for supplying the digital information signal; and means for switching the arithmetic decoder means into a decoding mode, the switching means including overruling means for overruling the probability signal to the arithmetic decoder means and applying a predetermined and fixed probability signal to the arithmetic decoder means, for decoding the one or more symbols of the arithmetically encoded digital information signal, which are substantially identical to the symbols of the arithmetically encoded digital information signal.

17. The apparatus of claim 16, in which:

the output signal is an n-level digital signal;

the overruling means applying a probability signal to the arithmetic decoder means for decoding the one or more symbols in the encoded digital information signal; and the applied probability signal including at least one probability value equal to 1/n.

18. The apparatus of claim 7, in which n=2.

19. The apparatus of claim 16, in which:

the overruling means include multiplexer means coupled between the probability signal generating means and the second input of the arithmetic decoder means; and the multiplexer means multiplexing the predetermined probability signal in response to a control signal in order to enable the decoding of the one or more symbols in the encoded digital information signal.

20. The apparatus of claim 16, in which the output signal is identical to the digital information signal prior to encoding.

21. The apparatus of claim 16, further comprising error correction means for carrying out an error correction on the encoded digital information signal prior to supplying the arithmetically encoded digital information signal to the first input of the arithmetic decoder means.

22. The apparatus of claim 16, further comprising channel decoding means for channel decoding the encoded digital information signal prior to supplying the arithmetically encoded digital information signal to the first input of the arithmetic decoder means.

23. The apparatus of claim 16, further comprising: reading means for reading the encoded digital information signal from a record carrier.

24. The apparatus of claim 15, in which:

the output signal is an n-level digital signal;

the overruling means applying a probability signal to the arithmetic decoder means for decoding the one or more symbols in the encoded digital information signal;

the probability signal including at least one probability value equal to 1/n;

n=2;

the overruling means include multiplexer means coupled between the probability signal generating means and the second input of the arithmetic decoder means;

the multiplexer means multiplexing the predetermined probability signal to its output in response to a control signal in order to enable the decoding of the one or more symbols in the encoded digital information signal;

the output signal is identical to the digital information signal;

the apparatus further comprising prediction filter means for deriving a predicted version of the digital information signal from the digital information signal;

the apparatus further comprising signal combination means for combining the output signal and the predicted version of the digital information signal so as to obtain a digital information signal;

the prediction filter means include a prediction filter for deriving a multi value prediction signal from the digital information signal;

the prediction filter means include quantizing means for quantizing the multi value prediction signal so as to obtain the predicted version of the digital information signal;

the probability signal generating means deriving the probability signal from the multi value prediction signal;

the apparatus further comprising error correction means for carrying out an error correction on the encoded digital information signal prior to supplying the encoded digital information signal to the first input of the arithmetic decoder means;

the apparatus further comprising channel decoding means for carrying out a channel decoding step on the encoded digital information signal prior to supplying the encoded digital information signal to the first input of the arithmetic decoder means;

the apparatus further comprising reading means for reading the encoded digital information signal from a record carrier; and the record carrier is as an optical or a magnetic record carrier.

25. The apparatus of claim 16, further comprising:

prediction filter means for deriving a predicted version of the digital information signal from the digital information signal; and signal combination means for combining the output signal and the predicted version of the digital information signal so as to obtain a digital information signal.

26. The apparatus of claim 25, in which the prediction filter means include:

a prediction filter for deriving a multi value prediction signal from the digital information signal; and quantizing means for quantizing the multi value prediction signal so as to obtain the predicted version of the digital information signal;

and in which the probability signal generating means derive the probability signal from the multi value prediction signal.

* * * * *